United States Patent [19]

Goodman et al.

[11] 4,091,527

[45] May 30, 1978

[54] METHOD FOR ADJUSTING THE LEAKAGE CURRENT OF SILICON-ON-SAPPHIRE INSULATED GATE FIELD EFFECT TRANSISTORS

[75] Inventors: Alvin Malcolm Goodman, Princeton; Charles Edward Weitzel, Plainsboro, both of N.J.

[73] Assignee: RCA Corporation, New York, N.Y.

[21] Appl. No.: 775,151

[22] Filed: Mar. 7, 1977

[51] Int. Cl.² ............................................. H01L 11/14
[52] U.S. Cl. ........................................ 29/571; 29/574; 29/590
[58] Field of Search .......................... 29/571, 574, 590; 148/1.5, 175, 187; 357/4, 23, 52

[56] References Cited

U.S. PATENT DOCUMENTS

| 3,867,196 | 2/1975 | Richman | 148/187 |
| 3,885,993 | 5/1975 | Tihanyi | 148/187 |
| 3,958,266 | 5/1976 | Athanas | 357/4 |
| 3,974,560 | 8/1976 | Mueller et al. | 29/590 |

OTHER PUBLICATIONS

Allison et al.; Thin-Film Silicon:Preparation, Properties, & Device Applications; pp. 1490-1498; Proceedings of the IEEE, vol. 57, No. 9, Sep. 1969.
Heiman; Thin-Film Silicon-on-Sapphire Deep Depletion MOS Transistors; pp. 855-862, IEEE Transactions on Electron Devices, vol. Ed-13, No. 12, Dec. 1966.

*Primary Examiner*—Gerald A. Dost
*Attorney, Agent, or Firm*—H. Christoffersen; D. S. Cohen

[57] ABSTRACT

A method for adjusting the leakage current of insulated gate field effect transistors comprised of silicon mesas epitaxially formed on a sapphire substrate, wherein the leakage current of a P channel transistor is increased by preoxidizing the silicon prior to standard processing and/or wherein the leakage current is decreased by annealing the silicon in a reducing atmosphere in addition to standard processing steps. The leakage current of an N channel transistor is reduced by preoxidizing the silicon of the transistor prior to forming the transistor and/or is increased by annealing in a reducing atmosphere in addition to the steps necessary for forming the transistor.

12 Claims, 37 Drawing Figures

METHOD FOR ADJUSTING THE LEAKAGE CURRENT OF SILICON-ON-SAPPHIRE INSULATED GATE FIELD EFFECT TRANSISTORS

This invention is generally related to a method for manufacturing silicon-on-sapphire (SOS) insulated-gate field effect transistors (IGFETs). Specifically, the invention is related to a method for adjusting the leakage current of silicon-on-sapphire field effect transistors by injecting or removing charge from the silicon-sapphire interface by a process of oxidation and annealing, respectively. The invention can be used for adjusting and balancing the relative leakage currents of a complementary set of SOS transistors by a process using oxidation and anneal steps in addition to those normally used in the silicon-on-sapphire process of manufacture.

In the manufacture of complementary silicon-on-sapphire integrated circuits comprising a P channel transistor and an N channel transistor it is desirable that the absolute value of the leakage current of both transistors be approximately the same and as low as possible. Heretofore, it has been difficult to achieve this because of unknown effects inherent in the process of manufacturing such circuits. One aspect of the present invention is a method by which the leakage current of P and N channel transistors of a complementary set may be equalized or individually changed.

In particular, in complementary silicon-on-sapphire field effect transistor (C/SOSFET) processing, almost always one of the complementary transistors has a higher leakage current than the other. The inventors have discovered that the reason for this is a combination of the oxidation and annealing steps used in the manufacture of such transistors. By optimizing the effects of these steps, the inventors have been able to equalize leakage current.

As background, a process for the production of a P channel field effect transistor in a semicondutor layer of silicon disposed in a spinel substrate wherein positive charges normally induced in the silicon by the presence of negative charges in the spinel are reduced, is disclosed in J. Tihanyi, U.S. Pat. No. 3,885,993, issued May 27, 1975, and entitled "Method for Production of P Channel Field Effect Transistors and Product Resulting Therefrom".

Furthermore, a process is known whereby regions having selectively different values of fixed positive surface charge density are formed on a common silicon wafer. In this process, a material which acts as an oxygen barrier is placed over a selected portion of the surface of the silicon to simulate a final anneal in an inert atmosphere only at the portion of the silicon surface underlying the oxygen barrier. The anneal establishes a minimum surface charge density thereunder. See U.S. Pat. No. 3,867,196, issued to Paul Richman on Feb. 18, 1975 and entitled "Method for Selectively Establishing Regions of Different Surface Charge Density in a Silicon Wafer".

U.S. Pat. No. 3,806,371, issued Apr. 23, 1974 to Barone and entitled "Method of Making Complementary Monolithic Insulated Gate Field Effect Transistors Having Low Threshold Voltage and Low Leakage Current" is a method for providing low threshold, low leakage current complementary insulated gate field effect transistors by gettering. A gettering layer of glass is deposited on the back of a wafer prior to gate oxidation. The glass acts as a getter and lowers the leakage current in the completed transistors.

In Barone, supra the rate of oxidation or oxide growth step provides a high density of bound surface charge under the gate insulator at the interface of the gate insulator and the substrate. The bound surface charge is reduced as desired by annealing in an inert atmosphere of nitrogen or argon.

Recently, in IBM Technical Disclosure Bulletin No. 3 at Vol. 118, issued August, 1975, Burkhardt et al. disclosed that charge reduction in a gate insulator may be achieved by a post-oxidation aneal in a reducing or neutral atmosphere.

In an article written by Allison et al. in the Proceedings of the IEEE, September, 1969, at page 1494 it is disclosed that a large electronic layer can be introduced at the bottom of the silicon surface adjacent a sapphire substrate if the silicon-on-sapphire film is heated for approximately 15 minutes in hydrogen or moisture at 500° to 1000° C.

In the drawings:

FIGS. 6–23 illustrate various steps in the novel process of the invention.

Figure 1:
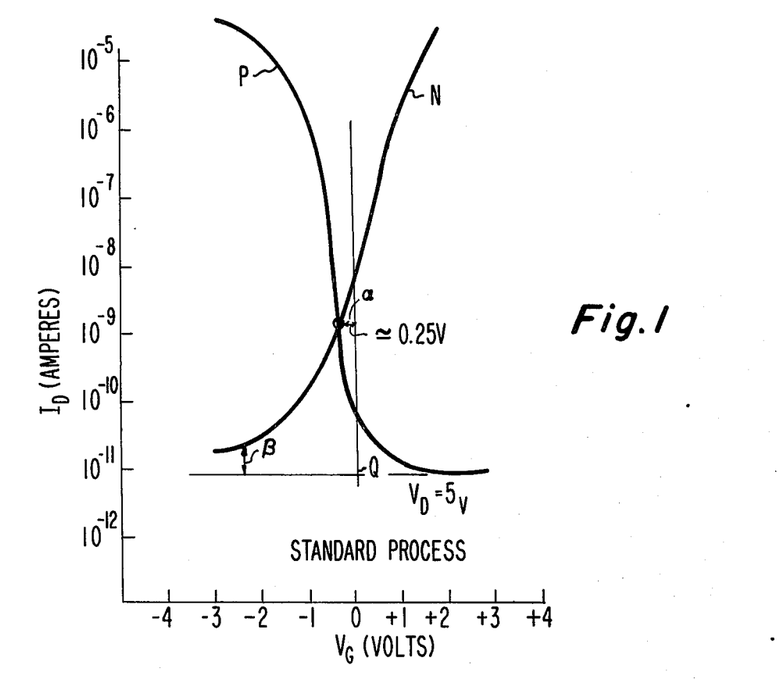
FIG. 1 is a plot of the gate transfer characteristics of a complementary silicon-on-sapphire transistor pair.
Figure 21:
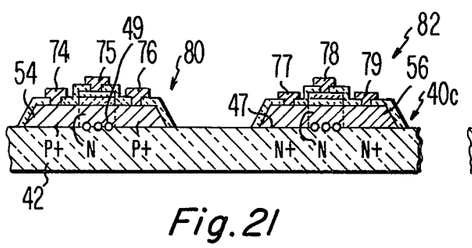

FIG. 1 shows an example of the gate transfer characteristics (drain current, $I_D$, versus gate voltage, $V_G$, at constant drain voltage, $V_D$) for a complementary pair of field effect transistors made by a process involving silicon mesas epitaxially formed on a sapphire substrate such as the complementary pair shown in FIG. 21. These gate transfer characteristics are representative of a complementary silicon-on-sapphire (CMOS/SOS) transistor pair comprising a P channel device and an N channel device. The N curve is for the N channel transistor and the P curve is for the P channel transistor. Drain voltage is 5 volts, for example. This pair is made by standard processing and no additional preoxidation or hydrogen annealing steps are used in the manufacture of the individual transistors.

Two significant features of the gate transfer characteristics shown in FIG. 1 are the parameters $\alpha$ and $\beta$ shown therein. $\alpha$ is defined as the absolute value of lateral displacement of the intersection of the gate transfer characteristics of the respective N and P channel devices from the 0 voltage line Q for the gate voltage. $\beta$, on the other hand, is the relative absolute difference between the leakage currents of the P and N channel devices when they are biased off. The method of the present invention is directed to the minimization and adjustment of the $\alpha$ and $\beta$ parameters for the gate transfer characteristics of the complementary SOS field effect transistor pair.

Figure 2:
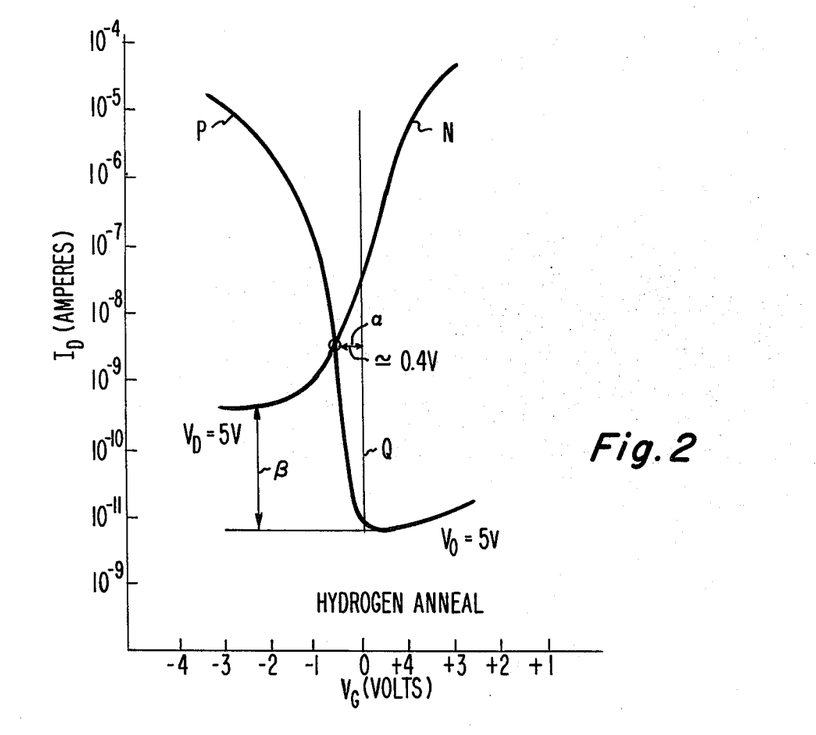
FIG. 2 is a plot of the gate transfer characteristics of a complementary silicon-on-sapphire transistor pair which has undergone an extra hydrogen annealing.

An understanding of some basic aspects of the invention may be acquired by referring to FIG. 2 and comparing FIG. 2 with FIG. 1. A comparison shows an increase of about 0.15 volt in α in FIG. 2. Also shown is an increase, by a factor greater than 10, in the absolute value of the β. FIGS. 1 and 2 represent similar pairs of transistors produced by the same process. The difference is the use in the process for the production of the transistor 2 in FIG. 2 of a hydrogen annealing step for a predetermined period of time. The inventors have discovered that hydrogen annealing increases the value of the α and β parameters.

Figure 3:
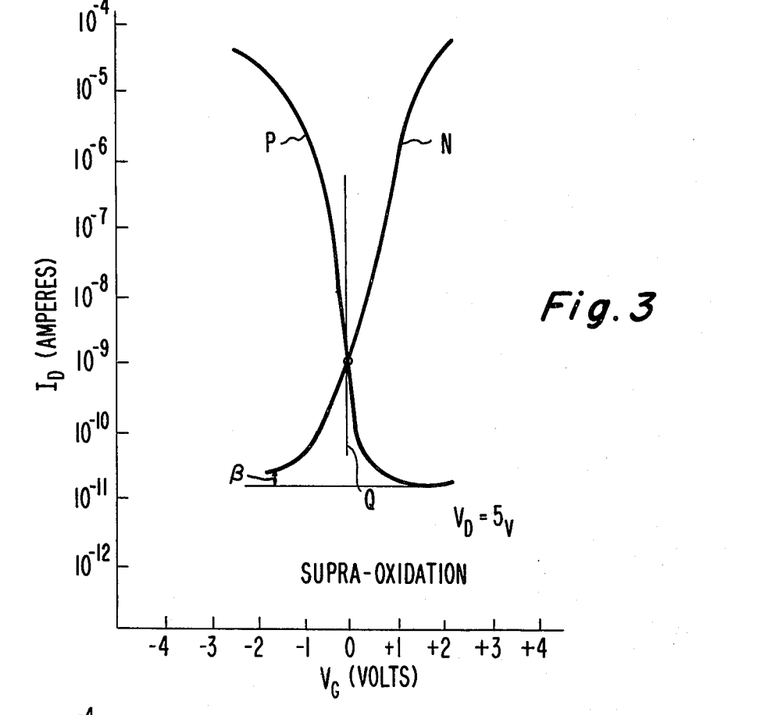
FIG. 3 is a plot of the gate transfer characteristics of the complementary silicon-on-sapphire transistor pair of FIG. 2 which has undergone an extra oxidation.

The aluminum connections to the complementary transistors having the gate transfer characteristics shown in FIG. 1 were removed and the devices annealed in hydrogen at 500° C for 1 hour. A shift in the gate transfer characteristics, and α and β, resembling that shown in FIG. 2 was realized. In addition to the regular processing steps used to produce the complementary field effect transistor having the gate transfer characteristics shown in FIG. 1, an additional or extra preoxidizing step was used wherein a silicon epitaxial layer used to produce the SOS composite for making the transistors was preoxidized at 900° C for approximately 2 hours in HCl-steam before fabricating the devices by the standard process used before. The gate transfer characteristics of a typical resultant transistor pair is shown in FIG. 3. There, α has been reduced to zero. Hence, the cross-over point of the P and N channel gate characteristics is at the zero line Q and the minimum leakage currents are balanced within a factor of three. β has been substantially reduced with respect to the β shown in FIG. 1.

Figure 4:
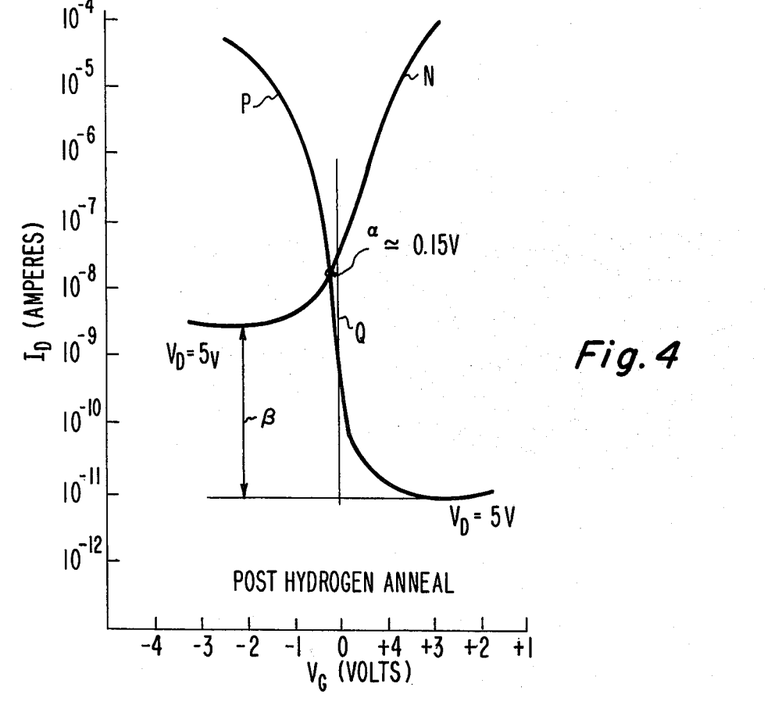
FIG. 4 is a plot of the gate transfer characteristics of the complementary silicon-on-sapphire transistor pair shown in FIG. 3 which has undergone an additional or extra hydrogen anneal.

If too large a shift of the crossover point had been produced by excessive preoxidation, (for example, by using too long an oxidation time or too high an oxidation temperature) and a positive value of $V_G$ had resulted, it would still be possible to adjust the crossover point (toward a more negative $V_G$ value) by a subsequent hydrogen annealing step. This is illustrated specifically in FIG. 4 wherein the wafer whose gate transfer characteristics are shown in FIG. 3, was hydrogen annealed for approximately 1 hour at 500° C with the aluminum connections removed. As shown, α has increased by approximately 0.15 volt and β has increased in excess of two orders of magnitude. Hence, anneal and preoxidation of the silicon-on-sapphire composite prior to standard processing have countervailing effects upon the leakage current and crossover point of the gate transfer characteristics of the P and N channel transistors of a complementary pair. Thus, by application of preoxidation and subsequent hydrogen annealing, substantially balanced leakage currents and zero-voltage crossovers of the gate transfer characteristics of P and N channel devices of a complementary set can be achieved.

Figure 5:
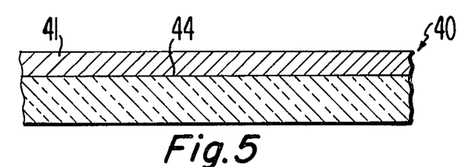
FIG. 5 is a partial cross-section of a silicon-on-sapphire composite.
Figure 6:
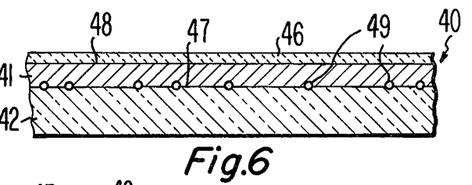
Figure 7:
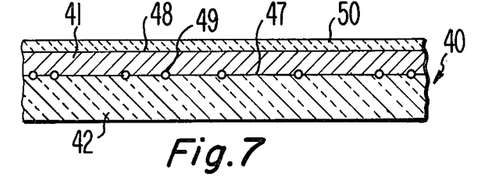

The present invention can be utilized in a production process exemplified as follows: A starting point in the method requires a composite 40 shown in FIG. 5 comprising an epitaxial silicon layer 41 deposited on a sapphire substrate 42. The sapphire substrate 42 has a major surface 44 onto which the layer 41 is epitaxially deposited, usually as a crystal with either a [111] or [100] orientation. Typically, the surface 44 is oriented substantially parallel to the [1102] plane of the sapphire crystal. The composite 40 is first cleaned and then subjected to a preoxidation step in accordance with the present method wherein an oxide layer 46 is grown on a major surface 48 of the silicon layer 41 by a step comprising oxidizing the silicon surface 48 in a steam atmosphere containing hydrogen chloride at a temperature of 900° C for approximately 2 hours, for example (FIG. 6). The hydrogen chloride-steam is produced by evaporation of a distilled water or purified water mixture containing approximately 20% hydrochloric acid. The preoxidation step causes negative charges 49 to be accumulated at the interface 47 between the silicon layer 41 and the sapphire substrate 42.

Next, the HCl-steam grown oxide layer 46 is removed from the composite 40 by etching, for example, using a solution such as buffered hydrofluoric acid at room temperature, for example. Typically, about 2500 A of HCl-steam grown oxide is formed for the layer 46. It requires approximately 2 minutes for the buffered hydrofluoric acid at a temperature of approximately 23° C to completely etch and remove the HCl-steam grown oxide. The underlying silicon layer 41 and the sapphire substrate 42 of the composite 40 are not etched.

Figure 8:
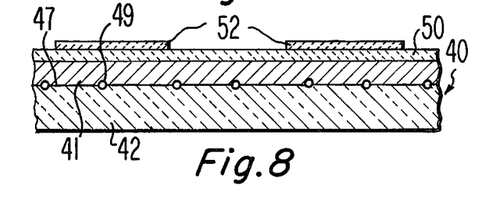
Figure 9:
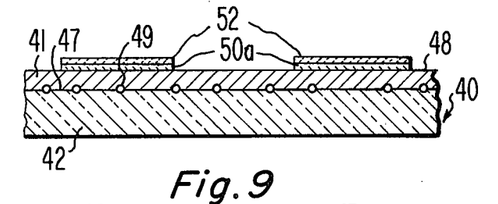

Next, a masking oxide for selective etching of silicon islands is grown in HCl-steam at 900° C for approximately 5 minutes. This grows an oxide layer 50 approximately 200 A thick. This layer 50 is subsequently masked as shown in FIG. 8 with a defined pattern of photoresist 52. The photoresist 52 is deposited adjacent the layer 50 which is adjacent the composite 40. The layer 50 is etched in the areas not protected by the photoresist 52 to form a silicon oxide mask 50a as shown in FIG. 9 which protects selected areas of the surface 48 of the silicon layer 41 on the sapphire substrate 42. The silicon dioxide layer 50a is defined using a buffered solution of hydrofluoric acid at 23° C (FIG. 9). The composite 40 with the photoresist 52 upon it is permitted to remain in the etching solution until the masking layer 50a is adequately defined. Subsequently, the photoresist layer 52 is removed.

Figure 10:
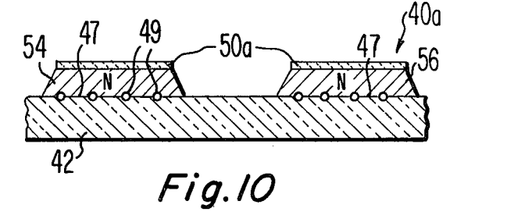

In FIG. 10, silicon mesas 54 and 56 are defined by etching in a solution of potassium hydroxide (KOH) at a temperature of 80° C for approximately 2 minutes, for example. Typically, the silicon islands 54 and 56 have a thickness of approximately ½ to 2 microns and the etching step takes approximately 1 to 10 minutes.

Figure 11:
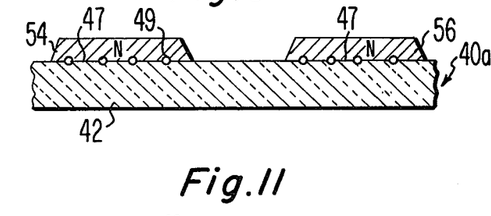

As shown in FIG. 11, the oxide mask 50a has been removed, leaving a composite 40a comprised of silicon mesas 54 and 56 on the sapphire substrate 42. Although both mesas 54 and 56 are doped N, the mesa 54 is later transformed into a P channel device and the mesa 56 is transformed into an N channel device. Typically, the mesas 54 and 56 are doped to an N concentration of approximately $1 \times 10^{15}/cm^3$, the original doping level of the epitaxially-formed silicon layer 41, illustrated in FIG. 5.

Figure 12:
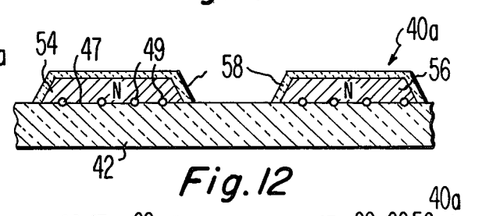
Figure 13:
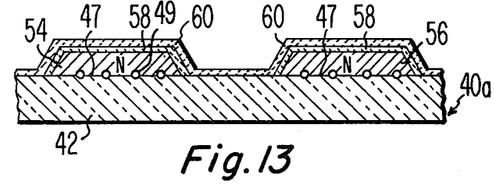
Figure 14:
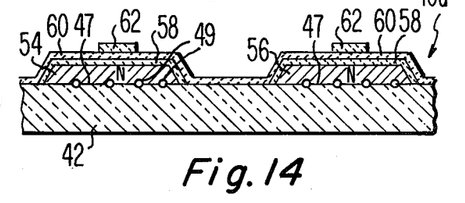
Figure 15:
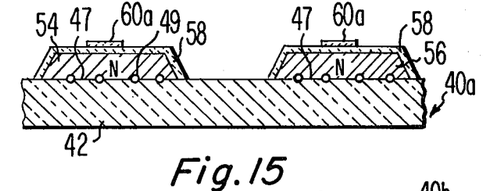

In FIG. 12, a channel oxide 58 is grown over the mesas 54 and 56 by an HCl steam oxidation process at 900° C for approximately 60 minutes. The channel oxide 58 is approximately 1200 A, for example. Layer 60 of polycrystalline silicon is deposited by pyrolysis of silane and hydrogen on the channel oxide layer 58. The polycrystalline layer 60 is defined into gates. A silicon dioxide mask 62 for defining polycrystalline silicon gates from the layer 60 is deposited on a portion of the layer 60 (FIG. 14). The polycrystalline silicon layer 60 is etched using the silicon dioxide mask 62 to form gate electrodes 60a as illustrated in FIG. 15. The polycrystalline silicon is doped either before or after defining by one of several techniques known in the art.

Figure 16:
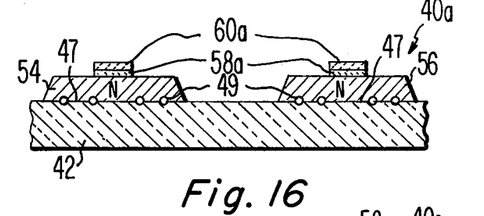

A new composite 40a as shown in FIG. 16 is formed using the polycrystalline silicon gates 60a to define the channel oxide 58 into channel insulator 58a. The channel oxide 58 is defined such as by buffered hydrofluoric acid at a temperature of approximately 23° C, for example. Typically, the layer 58 is approximately 1200 A thick and, accordingly, takes approximately 1 minute for the buffered hydrofluoric acid to remove the unmasked portions of the layer 58. The new composite 40b is now covered with a deposited layer of phosphorus-doped silicon dioxide which is defined such that it covers only the silicon mesa 56. A phosphorus-doped silicon dioxide layer formed from such a layer generally deposited over the entire composite 40b is illustrated in FIG. 17. A layer of boron-doped silicon dioxide is next deposited by standard methods over the entire composite 40b with the phosphorus-doped silicon dioxide layer 62 on the mesa 56. This boron-doped silicon dioxide layer 64 upon heating provides the P+ dopants for a P channel device to be formed from the mesa 54 of the composite 40b.

Figure 18:
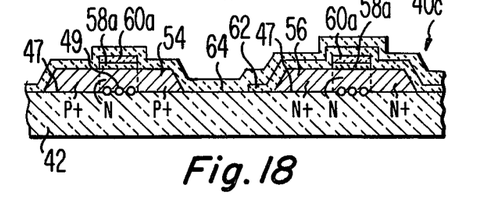

As shown in FIG. 18, impurities from the layer 64 and the layer 62 are driven into the respective silicon mesas 54 and 56 by heating the composite with the layers adjacent thereto.

Figure 19:
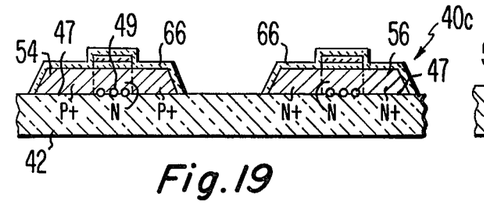
Figure 20:
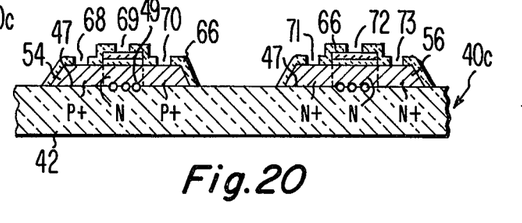

The source and drains are diffused into the silicon mesas 54 and 56 in an inert atmosphere such as helium at 1050° C for approximately 15 minutes, for example. The silicon dioxide layers 62 and 64 are subsequently removed such as by etching with a suitable known etchant and a new silicon dioxide layer 66 is grown on the composite 40b as shown in FIG. 19 by oxidation of the slicon in HCl-steam at 900° C for approximately 30 minutes. Alternatively, the doped oxide layers 62 and 64 may be left in place; in this embodiment, no additional passivation oxide, i.e. the layer 66, need be grown. Later, the composite 40b with layers 66 attached is annealed in hydrogen at 500° C for approximately 15 minutes. The silicon dioxide layer 66 serves to passivate the composite 40b. As shown in FIG. 20, contact holes are opened in the silicon dioxide layer 66.

Source and drain diffusions into the composite 40b forms a new composite 40c as shown in FIG. 18. The P+ diffusions of boron into the silicon mesa 54 forms a P+NP+ (P channel) field effect transistor when contacts are made to the source and drain therein. Specifically, contact holes 68, 69 and 70 are formed for the P channel transistor and contact holes 71, 72 and 73 are formed for the N+NN+ (N channel) transistor (FIG. 20). These contact holes are formed such as by selectively masking the silicon dioxide layers 66 with photoresist and etching the appropriate apertures 68 through 73 with buffered hydrofluoric acid, for example, at approximately 23° C.

Aluminum connections 74–79 are deposited in the holes 68–73, respectively, by first depositing a layer of aluminum by any of the standard known methods, for example evaporation, and subsequently masking the contact areas with photoresist and removing the unmasked areas by a suitable known etchant.

Figure 22:
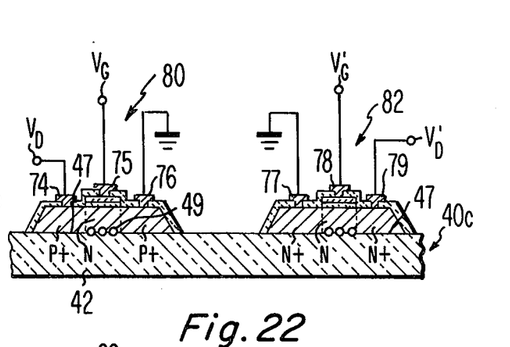

An improvement in devices made by the aforedescribed process in accordance with the present invention is illustrated by examining the gate transfer characteristics of the completed device shown in FIG. 21 in accordance with the circuit arrangement illustrated in FIG. 22, wherein the source contacts 76 and 77 are grounded and the drain contacts 74 and 79 have voltage inputs $V_D$ and $V'_D$. The P channel device 80 has a gate voltage $V_G$ applied to its gate contact 75 and the N channel device 82 has a gate voltage $V'_G$ applied to its gate contact 78. The gate voltages are swept from +4 volts to −4 volts, for example, in accordance with FIG. 3 in order to generate the gate transfer characteristics of the complementary pair of transistors 80 and 82. This is a critical aspect of the invention in that it determines the values of the $\alpha$ and $\beta$ parameters previously discussed. The $\alpha$ and $\beta$ values are determined by examining the gate transfer characteristics.

In the improved method of manufacture a measurement of the $\alpha$ and $\beta$ parameters from the gate transfer characteristics is made. The absolute value of the difference of the leakage currents of the P and N channel devices is indicated by the $\beta$ parameter. If the P channel transistor 80 has a leakage current close to the absolute value of the leakage current 82, i.e. $\beta \sim 0$, no improvements or additions to the processing steps are necessary. However, if the gate transfer characteristic is not as the one shown in FIG. 3 and, instead, the P channel transistor exhibits a higher leakage current than the N channel transistor and the parameter $\beta$ derived therefrom is not within an acceptable tolerance level, then regardless of whether or not there is an $\alpha$ parameter, the additional novel step is to anneal the transistors, for example the transistors 80 and 82, as shown in FIG. 22. Typically, the transistors are annealed in hydrogen at 500° C for approximately 15 minutes in a tube-type furnace.

Figure 23:
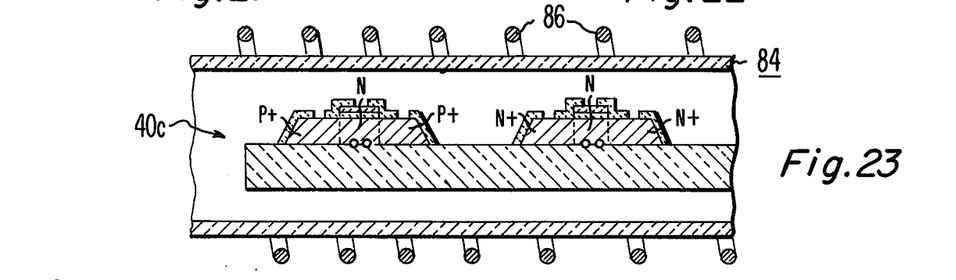

FIG. 23 illustrates the step of annealing the composite 40c at 500° C. Shown in FIG. 23 is a tube-type furnace 84 with heater elements 86. Within the furnace 84 is shown composite 40c undergoing an anneal in a hydrogen atmosphere. The furnace is purged or filled with pure hydrogen prior to the annealing step.

Subsequently, the device 40c is re-examined wherein the leakage current balance, i.e. the $\beta$ parameter, is redetermined. If the P channel device has a higher leakage current, the step illustrated by FIG. 23c wherein the transistor pair 40c is annealed in hydrogen at 500° C for approximately 15 minutes is repeated. This step is repeated until the leakage current is substantially balanced. A pair obtained having a P channel transistor with a lower leakage current than the N channel transistor is rejected.

Figures 24, 25, 26, 27:
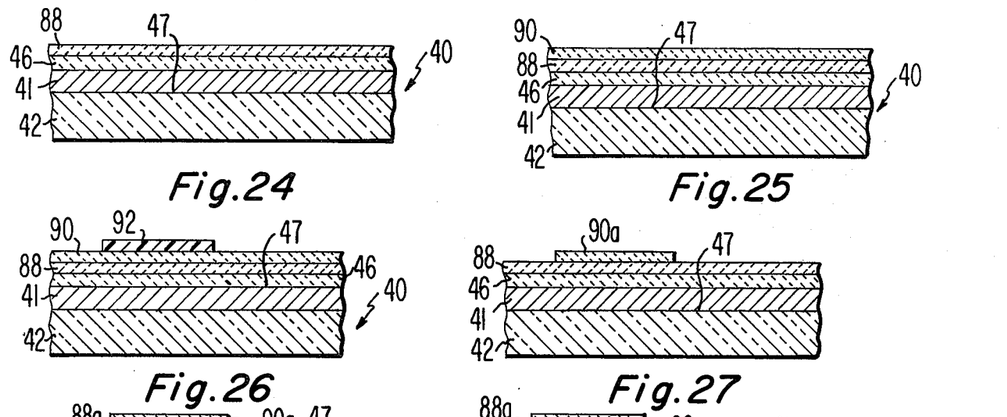
FIGS. 24–32 illustrate various steps in a variation of the novel method of the invention.
Figure 28:
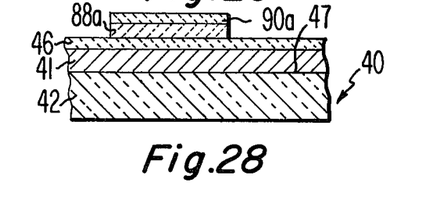

In another aspect of the invention the leakage current is either the P channel device or the N channel device of the complementary pair may be altered as desired. The selective alteration is achieved by taking the composite 40 shown in FIG. 6 and depositing on the silicon dioxide layer 46 a layer 88 of silicon nitride, for example. The silicon nitride may be deposited to a thickness of approximately 500 A, for example, by a reaction of silane with ammonia in a nitrogen carrier gas at 800° C for approximately 5 minutes as shown in FIG. 24. 1000 A of silicon dioxide is deposited on the silicon nitride layer 88. This layer 90 of silicon dioxide is used to selectively mask the silicon nitride layer 88. Photoresist 92 is deposited on a portion of the silicon dioxide masking layer 90 to define the layer 90 (see FIG. 26). The photoresist 92 is used to protect selected portions of the layer 90 from a buffered hydrofluoric acid etchant, for example. The resultant structure 40 is shown in FIG. 27 wherein there is a silicon dioxide mask 90a on the silicon nitride layer 88. Subsequently, using the silicon dioxide mask 90a, silicon nitride ($Si_3N_4$) is etched using a solution such as phosphoric acid ($H_3PO_4$) heated to a temperature of 180° C for approximately 15 minutes, for example. This forms a silicon nitride mask 88a underneath the mask 90a.

Figure 29:
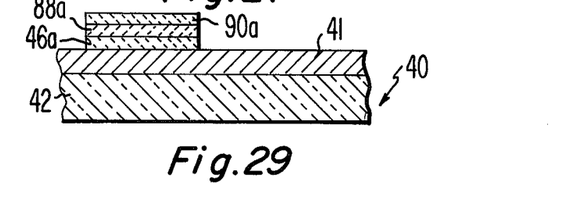

By selectively masking the P channel transistor using silicon nitride, the inventors have discovered that the effect of the preoxidation step on the part of interface 47 covered by the silicon nitride layer is nullified or does not take effect. It is theorized that no additional negative charge is accumulated at the interface 47 beneath the silicon protected by the nitride mask 90a. The silicon dioxide layer 46 is subsequently etched using the silicon nitride layer 88a as an etch mask. Buffered hydrofluoric acid, for example, is used at a temperature of 23° C for 15 seconds, presuming 1000 A of silicon dioxide for the layer 46. Hence, the resultant composite 40 as shown in FIG. 29 has a mask structure comprising a layer of silicon dioxide 90a, a layer of silicon nitride 88a supported by a layer of silicon dioxide 46a.

Figure 31:
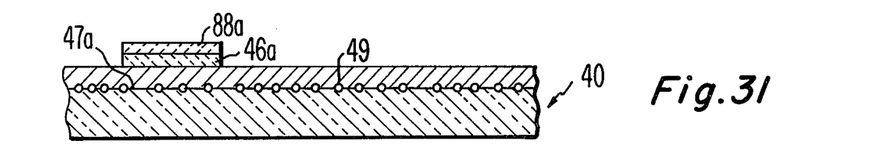

Next, a silicon dioxide layer 94 is grown on the surface 48 of the silicon layer 41 not masked by the silicon nitride 88a. The oxide layer 94 is formed by oxidation in HCl steam at 900° C for approximately 2 hours, for example. Upon completion of the oxidation step, the oxide layer 94 is removed along with the silicon dioxide mask 90a by buffered hydrofluoric acid, for example. The silicon nitride mask 88a and the supporting silicon dioxide layer 46a are removed from the composite 40 with solutions of phosphoric acid at 180° C and a buffered solution of hydrofluoric acid at 23° C, respectively, for example. The silicon nitride layer 88a is removed by a solution of phosphoric acid (H$_3$PO$_4$) at 180° C by immersion for approximately 15 minutes (FIG. 31). The composite 40 as shown in FIG. 32 is subjected to a solution of buffered hydrofluoric acid to remove the silicon dioxide layer 46a.

Figure 30:
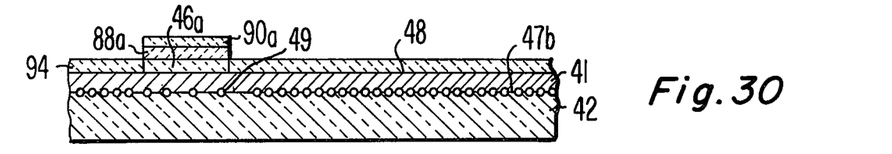

Upon completion of this step the interface 47 between the silicon layer 41 and the sapphire substrate 42 is transformed into a portion 47a wherein no additional fixed negative charge 49 is accumulated and a portion 47b, wherein, as a result of the oxidizing step illustrated in FIG. 30, fixed negative charge 49 is accumulated at the interface portion 47b.

Figure 32:
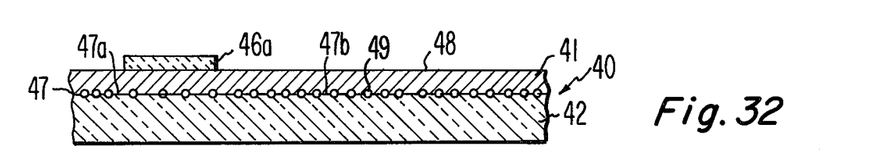

Next, processing is continued wherein a masking oxide layer 50 is formed over the interface portion 47a on the surface 48 of the composite 40 shown in FIG. 32. Additional processing steps are as previously indicated in FIGS. 8-22. The interface portion 47a is used for processing the P channel transistor.

In the process modification just presented, additional fixed negative charge 49 is accumulated and the interface region 47b in FIG. 32 which is confined below the N channel silicon-on-sapphire transistor subsequently formed by process steps illustrated in FIGS. 7-21. By preoxidizing the silicon used to form the N channel transistor 82 such that fixed negative charge 49 is accumulated at the interface 47b, the initial leakage current of the N channel transistor 82 is less than the leakage current of the P channel transistor 80 formed from silicon above the interface 47a since no additional fixed negative charge 40 has been permitted to accumulate at the interface 47a. Therefore, if after testing the device in accordance with the circuit shown in FIG. 22, the N channel device 82 has a leakage current which is below that of the P channel device 80, the leakage current of the P channel device may be reduced, β changed by one or two orders of magnitude, for example, by a subsequent hydrogen anneal at 500° C for a preselected period, for example, 15 minutes (FIG. 23). Since not as much charge or no charge is accumulated at the silicon sapphire interface 47a of the P channel device by the oxidation process which grew the oxide layer 94 (FIG. 30), and since subsequent annealing lowers the leakage current in the P channel transistor 80 and raises the leakage current of the N channel transistor 82, these respective leakage currents can be balanced to within an order of magnitude.

Alternatively, the leakage current in the P channel transistor 80 may be lowered by modification of the above process as illustrated using FIGS. 5-21. Specifically, by masking the portion of the epitaxial silicon layer 41 which is to be used or which comprises the N channel device 82, with silicon nitride or an equivalent material, the subsequent anneal step wherein positive charge is accumulated at the interface 47 between the silicon layer 41 and the substrate 42 is nullified in the N channel mesa 56 of the silicon layer 41 (FIG. 10). Accordingly, fixed positive charge is only accumulated at the interface 47 beneath the P channel mesa 54 and therfore lowers the leakage current of the P channel transistor 80 to be formed from the mesa 54 with respect to the leakage current of the N channel transistor 82 to be formed from the mesa 56.

Figure 33:
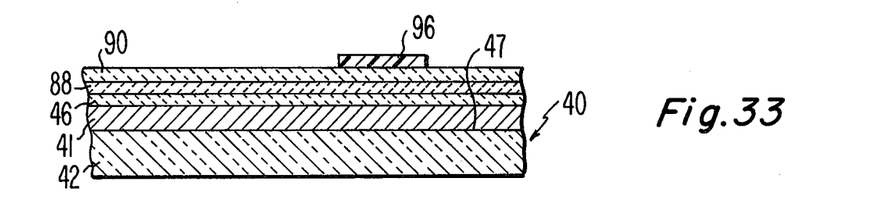
FIGS. 33–37 illustrate various steps of another variation of the novel process of the method of the invention.
Figure 34:
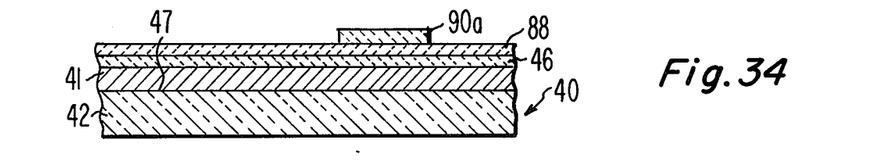

This modified process whereby the leakage current of the P channel transistor 80 as shown in FIG. 21 is adjusted starts with the SOS composite 40 and the adjacent layers as shown in FIG. 25. There is shown a composite 40 of a silicon epitaxial layer 41 on the sapphire substrate 42 with the sequential silicon dioxide layer 46, silicon nitride layer 88 and silicon dioxide masking layer 90. In FIG. 33, a photoresist mask 96 is placed on the silicon dioxide masking layer 90 over the portion of the silicon epitaxial layer 41 which is to comprise the N channel transistor 82. The silicon dioxide layer 90 is etched with a buffered hydrofluoric acid etchant at a temperature of 23° C, for example, until all the exposed portions are removed. The photoresist mask 96 is removed and the resultant structure is as shown in FIG. 34. There, a silicon dioxide mask 90a is shown on the silicon nitride layer 88. The mask 90a shields a portion of the slicon nitride layer 88 above the portion of the silicon dioxide layer 41 which is to comprise the N channel transistor 82. The exposed portions of the silicon nitride layer 88 are exposed to a phosphoric acid (H$_3$PO$_4$) solution at a temperature of 180° C, for example, until all the exposed portions are removed.

Figure 35:
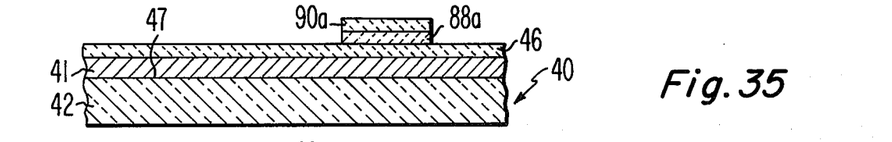

An intermediate structure is shown in FIG. 35. There is shown the silicon dioxide masking layer 90a apposed to a silicon nitride masking layer 88a formed from the layer 88. The unexposed portions of the silicon dioxide layer 46 are subjected to a buffered hydrofluoric acid etchant at room temperature, for example, until all the exposed portions are removed.

Figure 36:
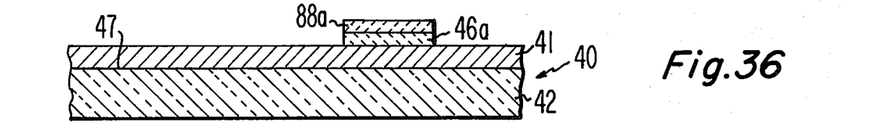

The silicon dioxide mask 90a in FIG. 35 is removed along with the exposed portions of the silicon dioxide layer 46. There remains a silicon nitride masking layer 88a supported by a defined layer of silicon dioxide 46a (FIG. 36). The silicon nitride masking layer 88a, in combination with the supporting mask of silicon dioxide 46a, shields a portion of the surface of the silicon epitaxial layer 41.

Figure 37:
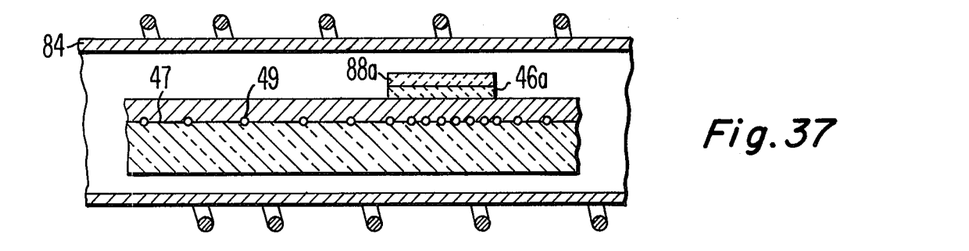

To lower the leakage current of a P channel transistor to be formed in the silicon below the silicon dioxide 46a, the composite 40 in FIG. 36 is subjected to a hydrogen anneal step wherein the composite 40 with the mask 88a and the silicon dioxide 46a apposed thereto is placed in the furnace 84 (FIG. 37).

Subsequent to the anneal step shown in FIG. 37, the masking layers 88a and 46a are removed in a manner similar to that described above with phosphoric acid and buffered hydrofluoric acid, respectively. Subsequent processing steps are not continued as illustrated in FIGS. 6 through 23.

In these latter embodiments of the novel invention, silicon nitride is used to prevent oxygen or hydrogen from reacting with or reaching the silicon-sapphire interface. The intermediate layer of silicon dioxide onto which the silicon nitride is deposited is used to provide adequate adhesion of the silicon nitride adjacent the silicon layer. The presence of the silicon nitride prevents the oxygen or hydrogen during either oxidation or annealing from changing the trapped charge 49 at the interface and therefore changing the transistor leakage current.

The critical aspect of the invention is the use of oxidation to make the interface charge between the silicon epitaxial layer and the sapphire substrate more negative in combination with the step wherein hydrogen annealing at a temperature of approximately 500° C, for example, is used to shift the interface charge less negative or more positive as desired to modify or adjust the relative difference in the leakage currents of complementary P and N channel transistors.

An additional utility of the novel invention as suggested by the present process is the use of preoxidation and additional hydrogen annealing in a process to adjust or lower the leakage current of a single P or N channel transistor not a part of the complementary pair.

We claim:

1. A method for making an insulated gate field effect P channel transistor having a reduced leakage current, in a body of silicon semiconductor of a first conductivity type having first and second major surfaces, the second major surface being on a sapphire substrate, comprising the steps of:
   forming a first oxide layer from said body of semiconductor on said first major surface;
   removing said first oxide layer;
   then forming in said body of semiconductor a field effect transistor having a leakage current with a gate region between a source region and a drain region, a second oxide forming an insulating layer over said gate region, the transistor having electrodes connected to said source and drain regions and said gate;
   measuring the leakage current of said transistor;
   subtracting the measured leakage current from a preselected leakage current value;
   annealing the transistor in hydrogen or an equivalent gas for a preselected time until said difference as subsequently measured is decreased.

2. A method according to claim 1, wherein said first oxide is produced by oxidation in steam containing hydrogen chloride.

3. A method according to claim 2, wherein said oxidation occurs at approximately 900° C. for approximately 2 hours.

4. A method according to claim 3, wherein said annealing is at approximately 500° C. for approximately 15 minutes.

5. In a method for making complementary silicon-on-sapphire field effect transistor pairs which comprises the steps of:
   forming an epitaxial silicon layer on a sapphire substrate;
   forming a mask of silicon dioxide on a portion of said silicon layer;
   removing an unmasked portion of the silicon layer whereby at least two silicon islands are formed;
   removing said mask from the silicon islands;
   forming a channel oxide on each of the silicon islands;
   forming a conductive gate on each of the channel oxides;
   placing P dopants into regions of one of the silicon islands, separated by a channel to form a P channel transistor;
   placing N dopants into regions of the other silicon island, separated by another channel to form an N channel transistor;
   forming a protective layer of silicon dioxide adjacent the silicon islands;
   forming connection openings in the protective layer;
   forming conductive connections in the connection openings;
   an improvement comprising the steps of:
   prior to forming the mask of silicon dioxide on the silicon layer oxidizing said epitaxial silicon layer whereby an additional silicon dioxide layer is formed on the silicon layer;
   removing the additional silicon dioxide layer before said mask is formed;
   after the transistors are formed measuring the absolute value of leakage current of each transistor;
   measuring the positive difference between absolute value of the leakage current of the P channel transistor and the absolute value of the leakage current of the N channel transistor;
   annealing both transistors in hydrogen or an equivalent gas for a preselected time until said measured positive difference between the absolute value of the leakage current of the P channel transistor and the absolute value of the leakage current of the N channel transistor as subsequently measured is decreased.

6. A method according to claim 5, wherein the additional silicon dioxide layer is produced by oxidation in steam containing hydrogen chloride.

7. A method according to claim 6, wherein said oxidation occurs at approximately 900° C. for approximately 2 hours.

8. A method according to claim 7, wherein said annealing is at approximately 500° C. for approximately 15 minutes.

9. A method for making a P channel silicon-on-sapphire mesa insulated gate field effect transistor having a preselected leakage current comprising the sequential steps of accumulating an excess of fixed negative charges into the silicon-sapphire interface by preoxidizing the silicon for preselected time, removing the oxidized silicon, forming an insulated gate field effect transistor in the silicon, and then removing a sufficient amount of said fixed negative charge at said interface by annealing the silicon in hydrogen or an equivalent gas for a preselected time period whereby the leakage current of the transistor as measured is substantially equal to the preselected leakage current.

10. A method for making an N channel silicon-on-sapphire mesa insulated gate field effect transistor having leakage current of a preselected absolute value comprising the sequential steps of accumulating fixed charges at the silicon-sapphire interface by preoxidizing the silicon for a preselected time, removing the oxidized silicon, forming an insulated gate field effect transistor in the silicon, and then accumulating a sufficient amount of fixed opposite charge near said interface by annealing the silicon in hydrogen or an equivalent gas for a preselected time whereby the absolute value of the leakage current of the transistor as measured is substantially equal to the preselected absolute value of the leakage current of said transistor.

11. In a method for making complementary silicon-on-sapphire field effect transistor pairs comprises the steps of:

growing an epitaxial silicon layer on a sapphire substrate;

forming a mask of silicon dioxide on said silicon layer; defining said mask;

removing an unmasked portion of the silicon layer whereby at least two silicon islands are formed;

removing said mask from the silicon islands;

forming a channel oxide on each of the silicon islands;

forming a conductive gate on each of the channel oxides;

placing P dopants into regions of one of the silicon islands separated by a channel to form a P channel transistor;

placing N dopants into regions of the other silicon island separated by another channel to form an N channel transistor;

forming a protective layer of silicon dioxide on the silicon islands;

forming connection openings in the protective layer;

forming conductive connections in the connection openings:

an improvement wherein the absolute value of the leakage current of the N channel transistor is reduced and the absolute value of the leakage current of the P channel transistor remains unchanged, comprising the steps of:

forming a thin, protective silicon dioxide layer on the P channel transistor;

depositing a thin, protective layer of silicon nitride on the protective silicon dioxide layer adjacent the P channel transistor;

oxidizing said N channel transistor whereby an additional silicon dioxide layer is formed on the N channel transistor; and removing the additional silicon dioxide layer, the thin protective silicon dioxide layer and the protective silicon nitride layer before said mask is formed.

12. In a method for making complementary silicon-on-sapphire field effect transistor pairs comprises the steps of:

forming an epitaxial silicon layer on a sapphire substrate;

forming a mask of silicon dioxide on said silicon layer; defining said mask removing an unmasked portion of the silicon layer whereby at least two silicon islands are formed;

removing said mask from the silicon islands;

forming a channel oxide on each of the silicon islands;

forming a conductive gate on each of the channel oxides;

placing P dopants into regions of one of the silicon islands separated by a channel to form a P channel transistor;

placing N dopants into regions of the other silicon island separated by another channel to form an N channel transistor;

forming a protective layer of silicon dioxide on the silicon islands;

forming connection openings in the protective layer;

forming conductive connections in the connection openings:

an improvement wherein the absolute value of the leakage current of the P channel transistor is reduced and the absolute value of the leakage current of the N channel transistor remains substantially unchanged, comprising the steps of:

forming a thin protective silicon dioxide layer on the N channel transistor;

depositing a thin protective layer of silicon nitride on the thin protective layer of silicon dioxide on the N channel transistor;

annealing the P channel transistor in a reducing atmosphere of hydrogen or an equivalent gas, whereby the thin protective layer of silicon dioxide and the thin protective layer of silicon nitride prevent annealing of the silicon in the N channel transistor.

* * * * *